(12) United States Patent
Liu et al.

(10) Patent No.: US 11,335,580 B2
(45) Date of Patent: May 17, 2022

(54) ERROR MEASUREMENT DEVICE OF LINEAR STAGE AND ERROR MEASUREMENT METHOD OF LINEAR STAGE

(71) Applicant: National Cheng Kung University, Tainan (TW)

(72) Inventors: Chien-Sheng Liu, Tainan (TW); Jie-Yu Zeng, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 103 days.

(21) Appl. No.: 17/071,510

(22) Filed: Oct. 15, 2020

(65) Prior Publication Data
US 2021/0335643 A1 Oct. 28, 2021

(30) Foreign Application Priority Data

Apr. 22, 2020 (TW) .................................. 109113549

(51) Int. Cl.
*H01L 21/67* (2006.01)
*H01L 21/68* (2006.01)

(52) U.S. Cl.
CPC ...... *H01L 21/681* (2013.01); *H01L 21/67115* (2013.01); *H01L 21/67259* (2013.01)

(58) Field of Classification Search
CPC ............ H01L 21/681; H01L 21/67115; H01L 21/67259
See application file for complete search history.

(56) References Cited

U.S. PATENT DOCUMENTS

| 5,740,062 A | * | 4/1998 | Berken | ................ | G05B 19/402 |
| | | | | | 414/935 |
| 2005/0282407 A1 | * | 12/2005 | Bruland | ............... | B23K 26/067 |
| | | | | | 438/795 |
| 2019/0361124 A1 | * | 11/2019 | Ogawa | .................. | G01S 7/4808 |

* cited by examiner

*Primary Examiner* — Hung V Nguyen
(74) *Attorney, Agent, or Firm* — Rabin & Berdo, P.C.

(57) ABSTRACT

An error measurement device and an error measurement method are provided. The optical measurement assembly of the error measurement device includes a light source, an optical lens, and a photoelectric sensor. The light beam emitted by the light source is transmitted to a sensing area on the photoelectric sensor to form a first optical path illuminating on a first light-spot position of the sensing area. The moving stage is moved by a linear displacement, so that the light beam is transmitted to the photoelectric sensor to form a second optical path illuminating on a second light-spot position of the sensing area. The processor calculates a movement error of the moving stage and controls the actuator to drive one or more of the light source, the optical lens, and the photoelectric sensor to perform a relative motion, so that the light beam illuminates on the first light-spot position again.

18 Claims, 9 Drawing Sheets

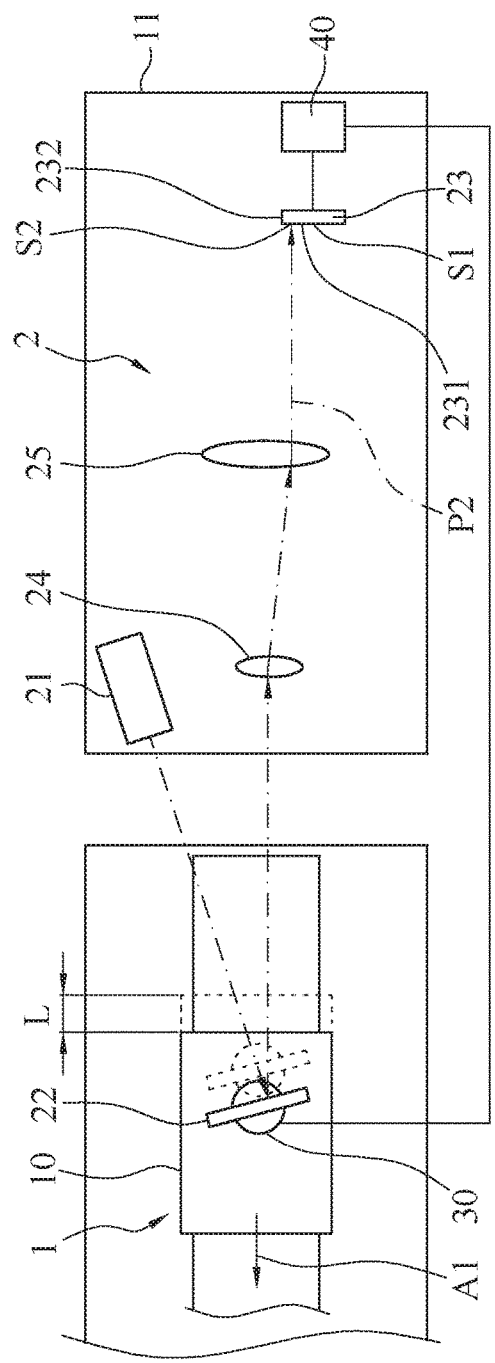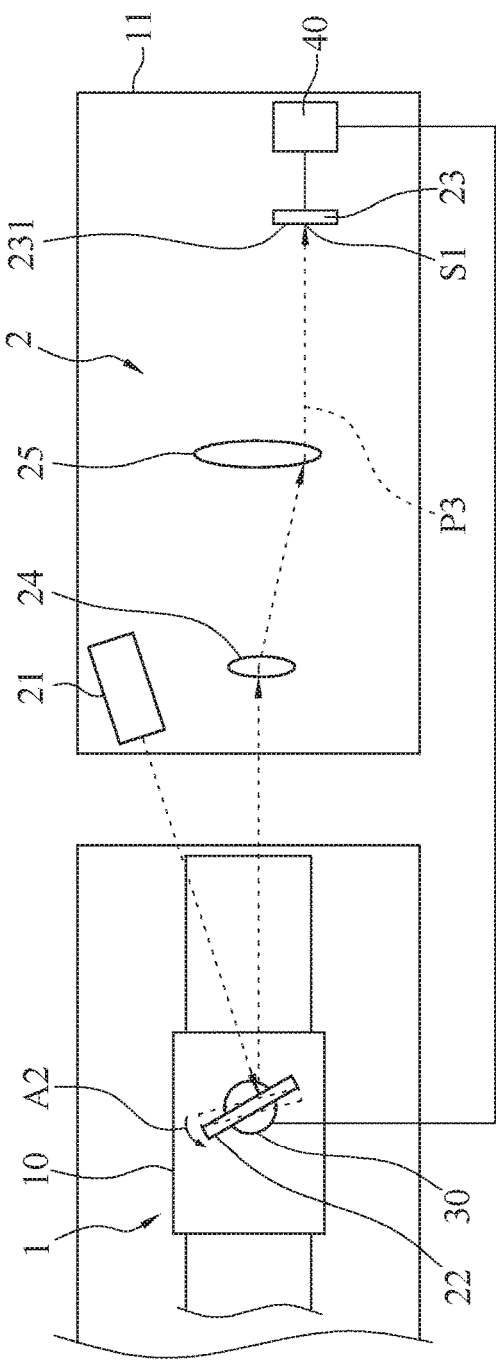

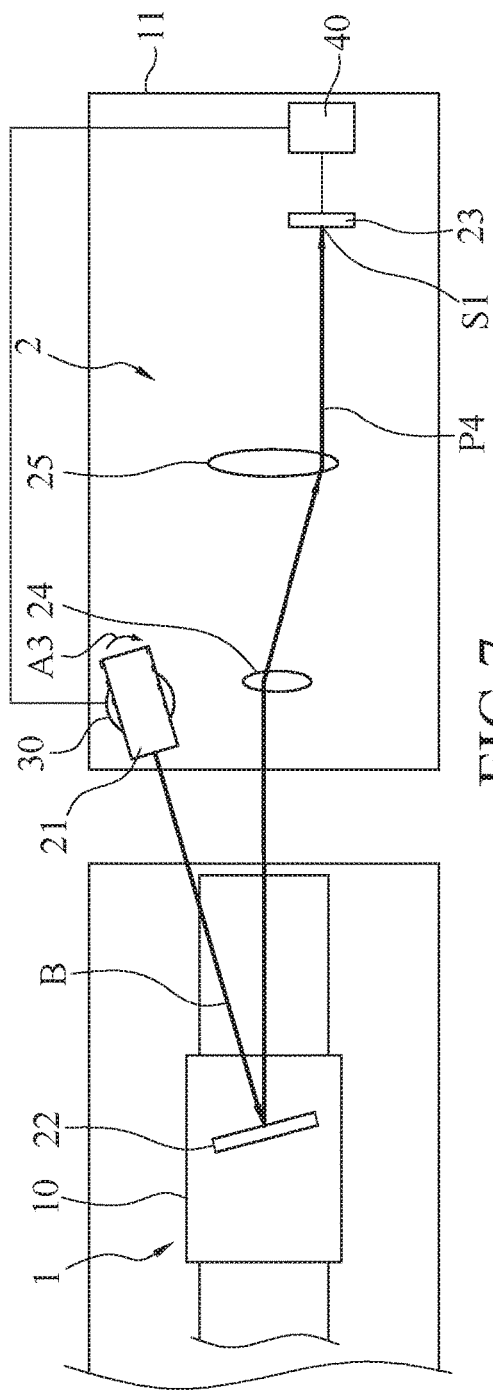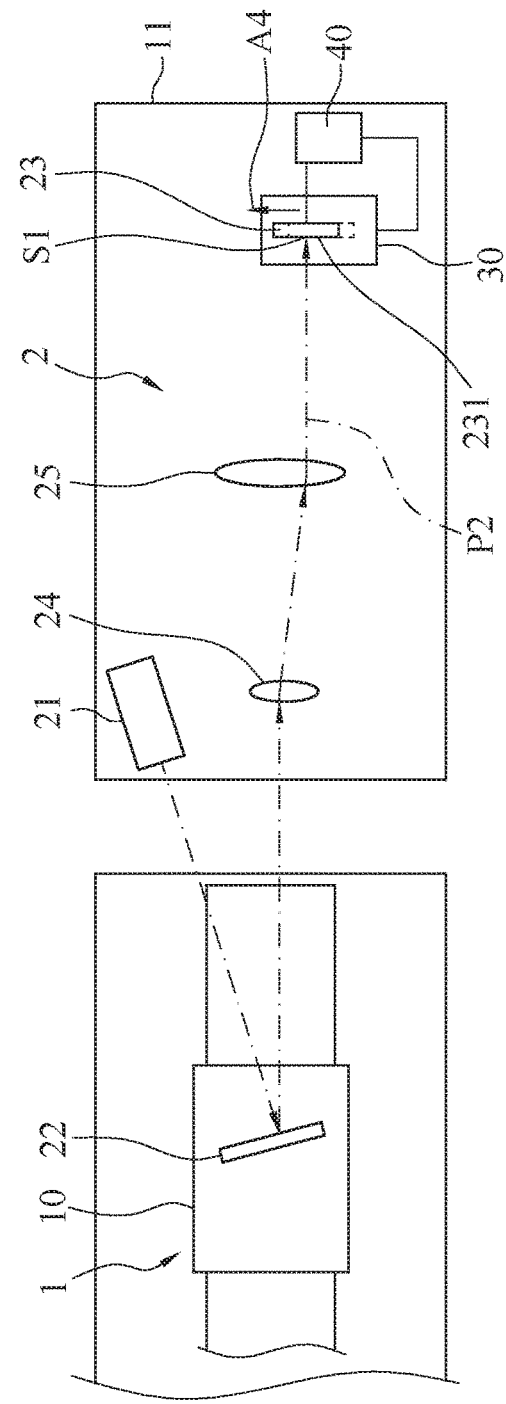

ERROR MEASUREMENT DEVICE OF LINEAR STAGE AND ERROR MEASUREMENT METHOD OF LINEAR STAGE

CROSS-REFERENCE TO RELATED APPLICATION

This non-provisional application claims priority under 35 U.S.C. § 119(a) to Patent Application No. 109113549 in Taiwan, R. O. C. on Apr. 22, 2020, the entire contents of which are hereby incorporated by reference.

BACKGROUND

Technical Field

This disclosure relates to measurement device and measurement method, in particular, to an error measurement device of linear stage and an error measurement method of linear stage.

Related Art

Along with the developments of technologies as well as the matureness of machine automation, machine tools are widely applied in national defense, aerospace, manufacturing, and other fields. As to the linear stage of the machine tool, the precision of the moving stage of the linear stage greatly influences the precision and the defect-free rate of the manufactured product. Hence, the error measurement technique for the linear stage plays an important role on this aspect.

SUMMARY

Regarding the error measurement for the linear stage, as realized by the inventor, optical measurement approaches are used in the industries, such as, laser interferometers, multi-axis calibrators, or triangulation-based laser rangefinders. However, the laser interferometers and the multi-axis calibrators are expensive and costive, while the available measurement range of the triangulation-based laser rangefinder is limited by the size of the sensor and is not suitable for long-traveling measurement. Moreover, the measurement resolution and measurement precision of the triangulation-based laser rangefinder become worse when the measurement distance increases.

In view of these, in one embodiment, an error measurement method of linear stage is provided. The error measurement method comprises following steps. The first step is forming a first optical path by using an optical measurement assembly. The optical measurement assembly comprises a light source, an optical lens, and a photoelectric sensor. The light source, the optical lens, and the photoelectric sensor are disposed on a moving stage of a linear stage, or two of the light source, the optical lens, and the photoelectric sensor are disposed on the moving stage of the linear stage. The first optical path is formed by emitting a light beam with the light source and transmitting the light beam to a sensing area on the photoelectric sensor through the optical lens, and the first optical path correspondingly illuminates on a first light-spot position of the sensing area. The second step is controlling the moving stage to move by a linear displacement, so that the light beam of the light source is transmitted to the photoelectric sensor through the optical lens to form a second optical path. The second optical path correspondingly illuminates on a second light-spot position of the sensing area, and a variation of position is between the first light-spot position and the second light-spot position. The third step is calculating a movement error of the moving stage according to the linear displacement and the variation of position. The fourth step is driving at least one selected from the light source, the optical lens, and the photoelectric sensor to perform a relative motion with respect to the moving stage by using an actuator. The relative motion makes the light beam correspondingly illuminate on the first light-spot position of the sensing area again.

In another embodiment, an error measurement device of linear stage is provided. The error measurement device comprises an optical measurement assembly, an actuator, and a processor. The optical measurement assembly comprises a light source, an optical lens, and a photoelectric sensor. The light source, the optical lens, and the photoelectric sensor are disposed on a moving stage of a linear stage, or two of the light source, the optical lens, and the photoelectric sensor are disposed on the moving stage of the linear stage. The light source emits a light beam, the light beam is transmitted to a sensing area on the photoelectric sensor through the optical lens to form a first optical path, and the first optical path correspondingly illuminates on a first light-spot position of the sensing area. The moving stage is moved by a linear displacement, so that the light beam of the light source is transmitted to the photoelectric sensor through the optical lens to form a second optical path. The second optical path correspondingly illuminates on a second light-spot position of the sensing area, and a variation of position is between the first light-spot position and the second light-spot position. The actuator is connected to at least one selected from the light source, the optical lens, and the photoelectric sensor. The processor is connected to the photoelectric sensor. The processor calculates a movement error of the moving stage according to the linear displacement and the variation of position. The processor is further connected to the actuator, and the processor controls the actuator to drive at least one selected from the light source, the optical lens, and the photoelectric sensor to perform a relative motion with respect to the moving stage. The relative motion makes the light beam correspondingly illuminate on the first light-spot position of the sensing area again.

In the error measurement method and error measurement device according to one or some embodiments of the instant disclosure, after the movement error of the moving stage is calculated according to the linear displacement and the variation of position of the moving stage, at least one selected from the light source, the optical lens, and the photoelectric sensor is driven by the actuator to perform the relative motion with respect to the moving stage, so that the light beam correspondingly illuminates on the first light-spot position of the sensing area again. Therefore, the moving stage can be moved continuously to perform the error measurement procedure, thereby preventing from the deflection of the light beam and preventing the light beam from going beyond the available sensing range of the photoelectric sensor. Accordingly, the error measurement for long-traveling motion can be achieved with minimum construction cost.

BRIEF DESCRIPTION OF THE DRAWINGS

The disclosure will become more fully understood from the detailed description given herein below for illustration only, and thus not limitative of the disclosure, wherein:

FIG. 5 illustrates a schematic view showing the second optical path of the error measurement device of the first embodiment;

FIG. 6 illustrates a schematic view showing the adjustment of the optical lens of the error measurement device of the first embodiment;

FIG. 7 illustrates a schematic view showing the adjustment of the light source of the error measurement device of the first embodiment;

FIG. 8 illustrates a schematic view showing the adjustment of the photoelectric sensor of the error measurement device of the first embodiment;

DETAILED DESCRIPTION

Figure 1:
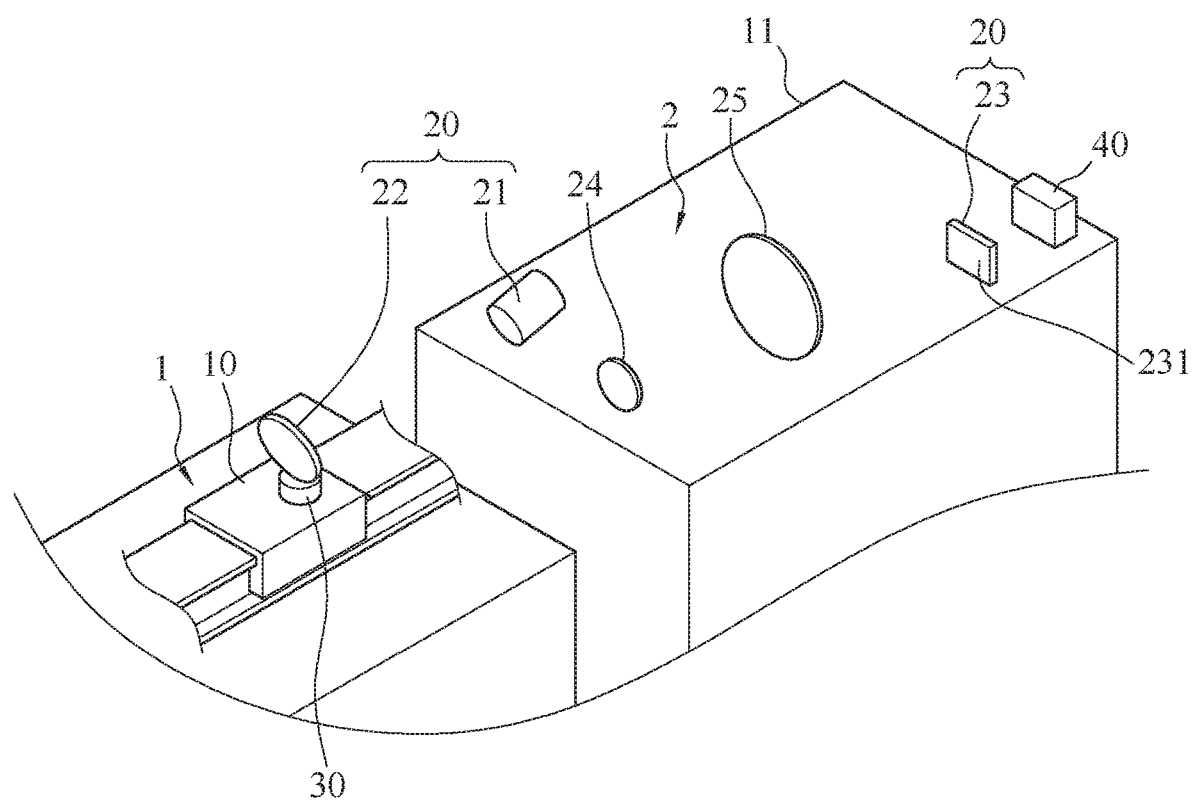
FIG. 1 illustrates a schematic architectural view of an error measurement device according to a first embodiment of the instant disclosure.
Figure 2:
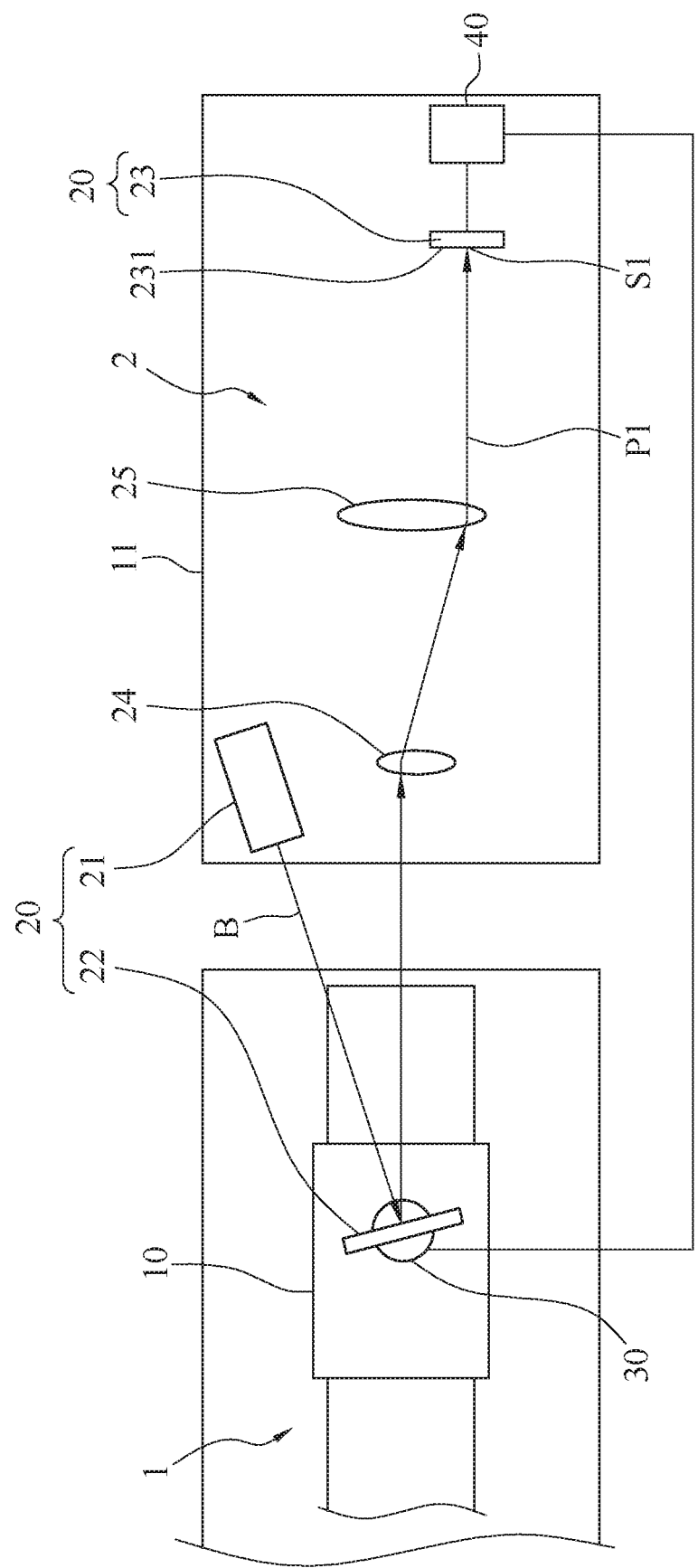
FIG. 2 illustrates a schematic view showing the optical path of the error measurement device of the first embodiment.

FIG. 1 illustrates a schematic architectural view of an error measurement device according to a first embodiment of the instant disclosure, and FIG. 2 illustrates a schematic view showing the optical path of the error measurement device of the first embodiment. As shown in FIGS. 1 and 2, the error measurement device 2 according to one or some embodiments of the instant disclosure is applied for measuring the geometric errors of the linear stage 1 generated during the motion of the linear stage 1, and the error measurement device 2 can perform the error measurement for a long-traveling motion with minimum construction costs.

The linear stage 1 may be the linear moving platform on different types of machine tools; for example, the linear stage 1 may be a linear rail, a ball screw, a ball spline, or the like. The linear stage 1 has a moving stage 10. For example, supposed that the linear stage 1 is a linear rail (as shown in FIGS. 1 and 2), the moving stage 10 is a slidable stage on the rail; supposed that the linear stage 1 is a ball screw, the moving stage 10 is the screw or the nut capable of having a relative motion with respect to each other.

As shown in FIGS. 1 and 2, the error measurement device 2 comprises an optical measurement assembly 20, an actuator 30, and a processor 40. In some embodiments, the actuator 30 is a power device capable of converting a control signal into a power for pushing the controlled object. For example, the actuator 30 may be an AC motor (or a DC motor), a stepper motor, or a hydraulic motor (or a pneumatic motor) to control the controlled object to perform a rotational motion. Alternatively, the actuator 0 may be a hydraulic cylinder (or a pneumatic cylinder) or a linear motor to control the controlled object to perform a linear motion. The processor 40 may be a programmable microprocessor, a digital signal processor (DSP), a programmable controller, an application specific integrated circuit (ASIC), a programmable logic device (PLD), or the like.

As shown in FIGS. 1 and 2, the optical measurement assembly 20 comprises a light source 21, an optical lens 22, and a photoelectric sensor 23. In some embodiments, the light source 21 may be a laser light source. For example, the light source 21 may be a gas laser emitter, a carbon dioxide laser emitter, a liquid laser emitter, a solid laser emitter, a semiconductor laser emitter, or other laser emitters. The optical lens 22 may be a reflecting prism, a refracting prism, a plano-convex lens, a plano-concave lens, a plane mirror, or the like. The photoelectric sensor 23 may be charge-coupled device (CCD), a complementary metal-oxide semiconductor (CMOS), a complementary metal-oxide semiconductor active pixel sensor (CMOS active pixel sensor), a position sensitive detector (PSD), or the like.

The light source 21, the optical lens 22, and the photoelectric sensor 23 of the optical measurement assembly 20 may be disposed on the moving stage 10 of the linear stage 1, or two of the light source 21, the optical lens 22, and the photoelectric sensor 23 may be disposed on the moving stage 10 of the linear stage 1. Moreover, the light source 21 may emit a light beam B, and the light beam B is transmitted to the sensing area 231 on the photoelectric sensor 23 through the optical lens 22. The processor 40 is connected to the photoelectric sensor 23, and the processor 40 calculates the error generated during the movement of the moving stage 10 according to the variation of position of the light beam B on the sensing area 231.

Moreover, the processor 40 is further connected to the actuator 30. After the calculation is performed and the error is obtained, the processor 40 further controls the actuator 30 to drive at least one selected from the light source 21, the optical lens 22, and the photoelectric sensor 23 to perform a relative motion (e.g., a rotational motion or a linear motion) with respect to the moving stage 10. Therefore, the deflection of the light beam B can be prevented, and the light beam B can be prevented from going beyond the available sensing range of the photoelectric sensor 23. Accordingly, the error measurement for long-traveling motion can be achieved with minimum construction cost. Related descriptions are provided below along with figures for explaining the operations of the error measurement method and how the components in the error measurement device 2 collaborate with each other.

Figure 3:
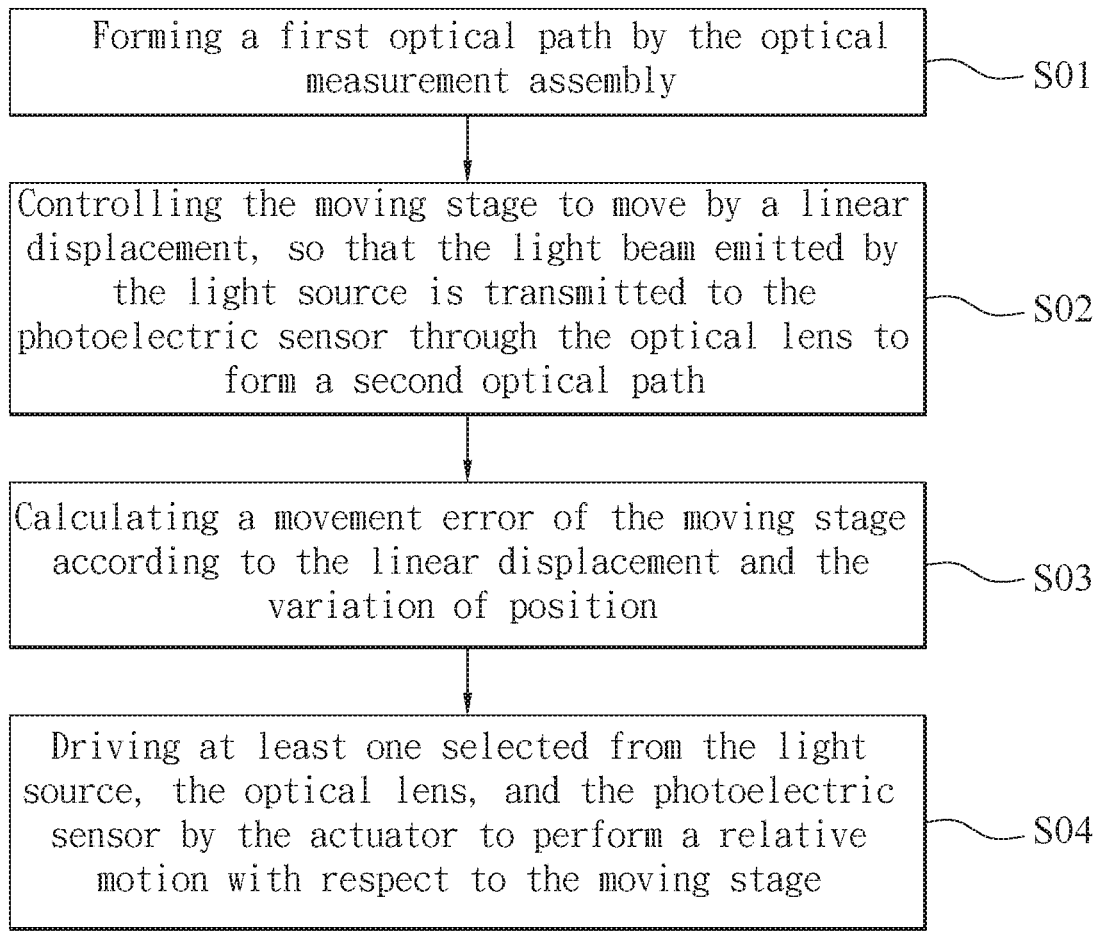
FIG. 3 illustrates a flowchart of an error measurement method according to an exemplary embodiment of the instant disclosure.

Please refer to FIG. 3. FIG. 3 illustrates a flowchart of an error measurement method according to an exemplary embodiment of the instant disclosure. During the error measurement of the moving stage 1, firstly, a first optical path P1 is formed by the optical measurement assembly 20 (step S01). Please also refer to FIG. 2, in this embodiment, the optical lens 22 of the optical measurement assembly 20 is a reflecting mirror and is disposed on the moving stage 10 of the linear stage 1, so that the optical lens 22 and the moving stage 10 can be moved at the same time. On the other hand, the light source 21 and the photoelectric sensor 23 are respectively disposed on a fixed stage 11 out of the moving stage 10. After the light source 21 emits the light beam B, the light beam B is transmitted to the sensing area 231 on the photoelectric sensor 23 through the reflection of the optical lens 22 to form the first optical path P1. The first optical path P1 correspondingly illuminates on a first light-spot position S1 on the sensing area 231. Preferably, in one embodiment, the first light-spot position S1 is at a center portion of the sensing area 231. For example, the first light-spot position S1 may be the center of the sensing area 231 (as illustrated in FIG. 2).

In some embodiments, the optical measurement assembly 20 may further comprise other lenses disposed between the optical lens 22 and the photoelectric sensor 23. Hence, the light beam B emitted by the light source 21 can be reflected by the optical lens 22 and then pass through the lenses and illuminate on the sensing area 231 on the photoelectric sensor 23. As shown in FIG. 2, in this embodiment, the optical measurement assembly 20 further comprises a plurality of lenses 24, 25, and the lenses 24, 25 may be refracting prisms, plano-convex lenses, or plano-concave lenses. The lens 24 and the lens 25 may be the same type or different types of lenses. Therefore, the light beam B emitted by the light source 21 can be reflected by the optical lens 22 and then refracted by the lenses 24, 25 and illuminate on the sensing area 231.

In addition to the embodiment shown in FIG. 2, the optical measurement assembly 20 may have other configurations. Specifically, in some embodiments, one or two of the light source 21, the optical lens 22, and the photoelectric sensor 23 of the optical measurement assembly 20 may be disposed on the moving stage 10 of the linear stage 1. Examples are provided as below.

Figure 9:
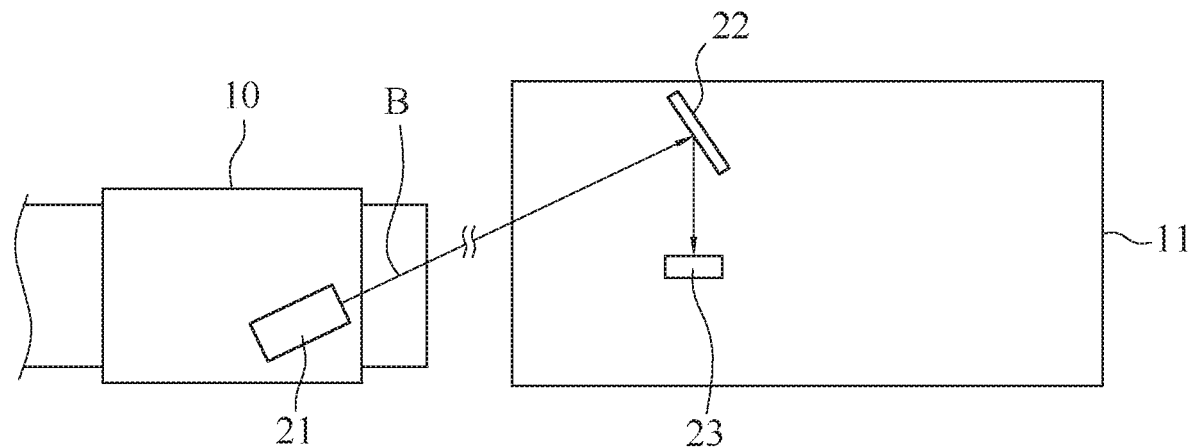
FIG. 9 illustrates a schematic architectural view of an error measurement device according to a second embodiment of the instant disclosure.

Please refer to FIG. 9. FIG. 9 illustrates a schematic architectural view of an error measurement device according to a second embodiment of the instant disclosure. One difference between this embodiment and the embodiment shown in FIG. 2 is that, in this embodiment, the optical lens 22 of the optical measurement assembly 20 is a reflecting mirror, and the optical lens 22 and the photoelectric sensor 23 are disposed on the fixed stage 11; on the other hand, the light source 21 is disposed on the moving stage 10, so that the light source 21 and the moving stage 10 can be moved at the same time. Hence, similarly, the light source 21 can emit the light beam B, and the light beam B can be reflected by the optical lens 22 and transmitted to the photoelectric sensor 23 to form the optical path.

Figure 10:
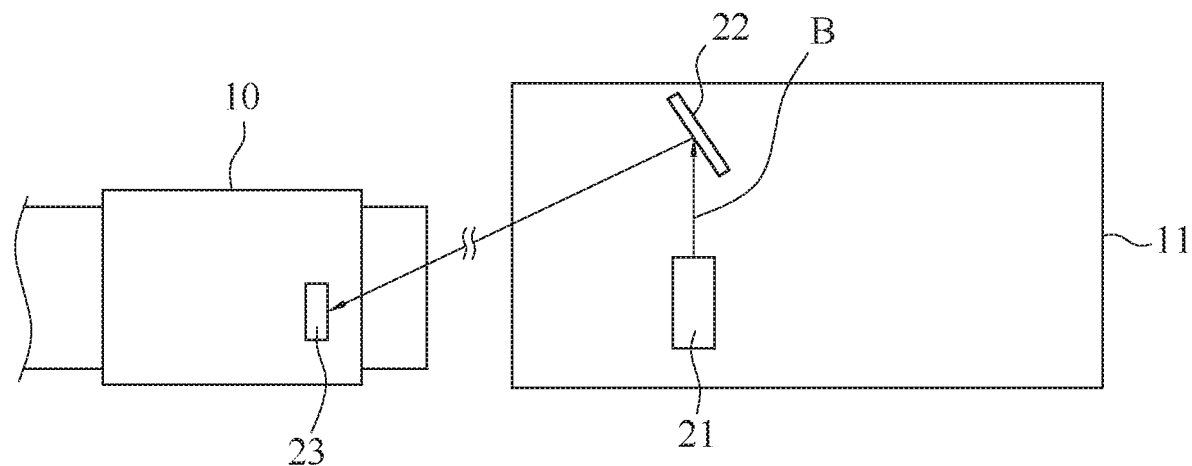
FIG. 10 illustrates a schematic architectural view of an error measurement device according to a third embodiment of the instant disclosure.

Please refer to FIG. 10. FIG. 10 illustrates a schematic architectural view of an error measurement device according to a third embodiment of the instant disclosure. One difference between this embodiment and the embodiment shown in FIG. 2 is that, in this embodiment, the optical lens 22 of the optical measurement assembly 20 is a reflecting mirror, and the optical lens 22 and the light source 21 are disposed on the fixed stage 11; on the other hand, the photoelectric sensor 23 is disposed on the moving stage 10, so that the photoelectric sensor 23 and the moving stage 10 can be moved at the same time. Hence, similarly, the light source 21 can emit the light beam B, and the light beam B can be reflected by the optical lens 22 and transmitted to the photoelectric sensor 23 to form the optical path.

Figure 11:
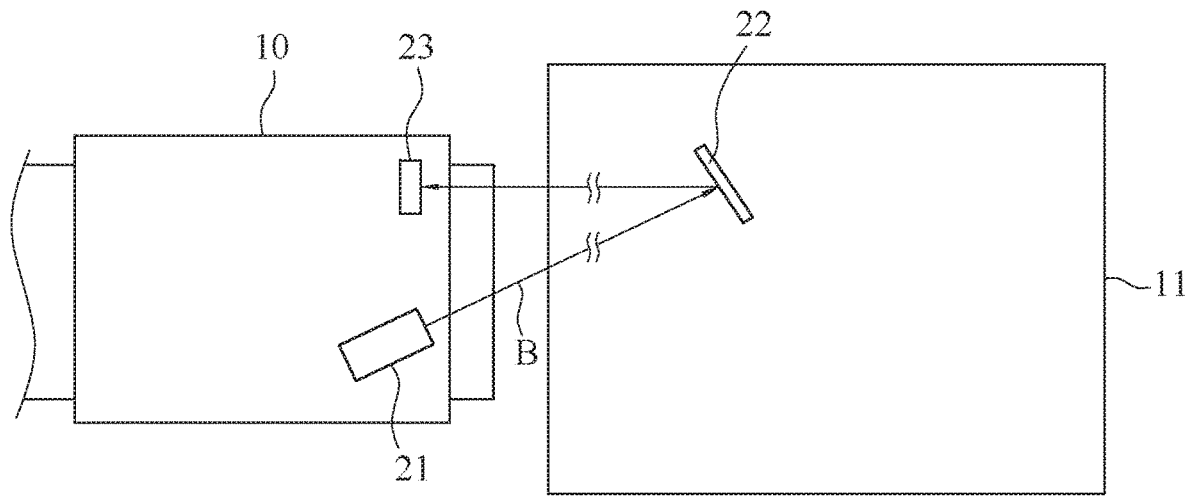
FIG. 11 illustrates a schematic architectural view of an error measurement device according to a fourth embodiment of the instant disclosure.

Please refer to FIG. 11. FIG. 11 illustrates a schematic architectural view of an error measurement device according to a fourth embodiment of the instant disclosure. One difference between this embodiment and the embodiment shown in FIG. 2 is that, in this embodiment, the optical lens 22 of the optical measurement assembly 20 is a reflecting mirror, and the optical lens 22 is disposed on the fixed stage 11 alone; on the other hand, the light source 21 and the photoelectric sensor 23 are disposed on the moving stage 10, so that the light source 21, the photoelectric sensor 23, and the moving stage 10 can be moved at the same time. Hence, similarly, the light source 21 can emit the light beam B, and the light beam B can be reflected by the optical lens 22 and transmitted to the photoelectric sensor 23 to form the optical path.

Figure 12:
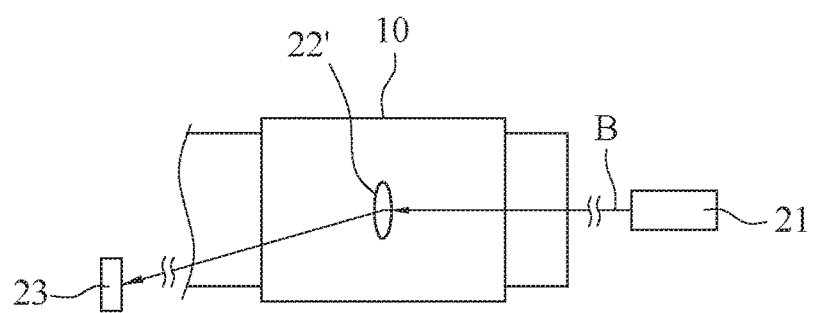
FIG. 12 illustrates a schematic architectural view of an error measurement device according to a fifth embodiment of the instant disclosure.

Please refer to FIG. 12. FIG. 12 illustrates a schematic architectural view of an error measurement device according to a fifth embodiment of the instant disclosure. One difference between this embodiment and the embodiment shown in FIG. 2 is that, in this embodiment, the optical lens 22' of the optical measurement assembly 20 is a lens, and the optical lens 22' is disposed on the moving stage 10, so that the optical lens 22' and the moving stage 10 can be moved at the same time; on the other hand, the light source 21 and the photoelectric sensor 23 are disposed out of the moving stage 10 and are at opposite sides of the optical lens 22'. Therefore, the light source 21 can emit the light beam B, and the light beam B can be refracted by the optical lens 22' and transmitted to the photoelectric sensor 23 to form the optical path.

As shown in the embodiments of FIGS. 9 to 12, as long as one or two of the light source 21, the optical lens 22, and the photoelectric sensor 23 of the optical measurement assembly 20 is disposed on the moving stage 10 of the linear stage 1, the light beam B emitted by the light source 21 can be transmitted to the photoelectric sensor 23 through the optical lens 22. Hence, possible configurations are not fully described; in the figures, it is understood that, the same number is used for indicating same or similar elements.

Moreover, as shown in FIG. 3, after the step S01, the moving stage 10 is controlled to be moved by a linear displacement L, so that the light beam B emitted by the light source 21 is transmitted to the photoelectric sensor 23 through the optical lens 22 to form a second optical path P2 (step S02). Please refer to FIGS. 2 and 5. The moving stage 10 may be controlled to be moved by a linear displacement L toward a direction away from the light source 21 and the photoelectric sensor 23 (as indicated by arrow A1, namely, a direction away from the fixed stage 11). Since the optical lens 22 is moved along with the movement of the moving stage 10 (in the embodiments shown in FIGS. 9 to 11, the light source 11, or the photoelectric sensor 23, or both the light source 11 and the photoelectric sensor 23 are moved along with the movement of the moving stage 11). Hence, the illumination position of the light beam B on the optical lens 22 is changed, and a second optical path P2 (as shown in FIG. 5) different from the first optical path P1 (as shown in FIG. 2) is generated. The second optical path P2 correspondingly illuminates on a second light-spot position S2 of the sensing area 231, and a variation of position is between the first light-spot position S1 and the second light-spot position S2.

Please refer to FIGS. 2 and 5. In this embodiment, the first light-spot position S1 is the center of the sensing area 231, and the second light-spot position S2 is offset from the center of the sensing area 231, so that the variation of position is between the first light-spot position S1 and the second light-spot position S2. In other words, the illumination position of the light beam B on the sensing area 231 may be changed along with the movement of the moving stage 10.

In some embodiments, the linear displacement L of the moving stage 10 may be determined according to the actual requirements for the measurement; the linear displacement L is mainly determined based on a premise that the second light-spot position S2 does not exceed beyond the available sensing range of the sensing area 231. For example, supposed that the total displacement of the moving stage 10 is 15 mm, in the step S02, the linear displacement L of the moving stage 10 every time may be 1.5 mm, 2 mm, or 3 mm. In other words, the linear displacement L is less than the total displacement of the moving stage 10. Hence, though the second light-spot position S2 is offset from the center of the sensing area 231 (that is, in these embodiments, the first light-spot position S1), the second light-spot position S2 is still within the available sensing range of the sensing area 231. Moreover, as shown in FIG. 5, preferably in one embodiment, the second light-spot position S2 is adjacent to the boundary 232 of the sensing area 231. Hence, the linear displacement L of the moving stage 10 can be maximized every time to accelerate the measurement, but embodiments are not limited thereto.

In some embodiments, the moving stage 10 may be controlled by the processor 40 directly or may be controlled by other external devices. For instance, the processor 40 may be connected to a motor for driving the moving stage 10, so that the processor 40 controls the moving stage 10 to move by the linear displacement L.

Next, as shown in FIG. 3, after the step S02, a movement error of the moving stage 10 is calculated according to the linear displacement L and the variation of position (step S03). Please refer to FIG. 5, the processor 40 may be connected to the photoelectric sensor 23 to obtain the variation of position between the first light-spot position S1 and the second light-spot position S2, and the processor can input the variation of position into a mathematical model to calculate the movement error (e.g., the positional error, the straightness error, or the angular error) of the moving stage 10 after the moving stage 10 is moved by the linear displacement L.

Figure 13:
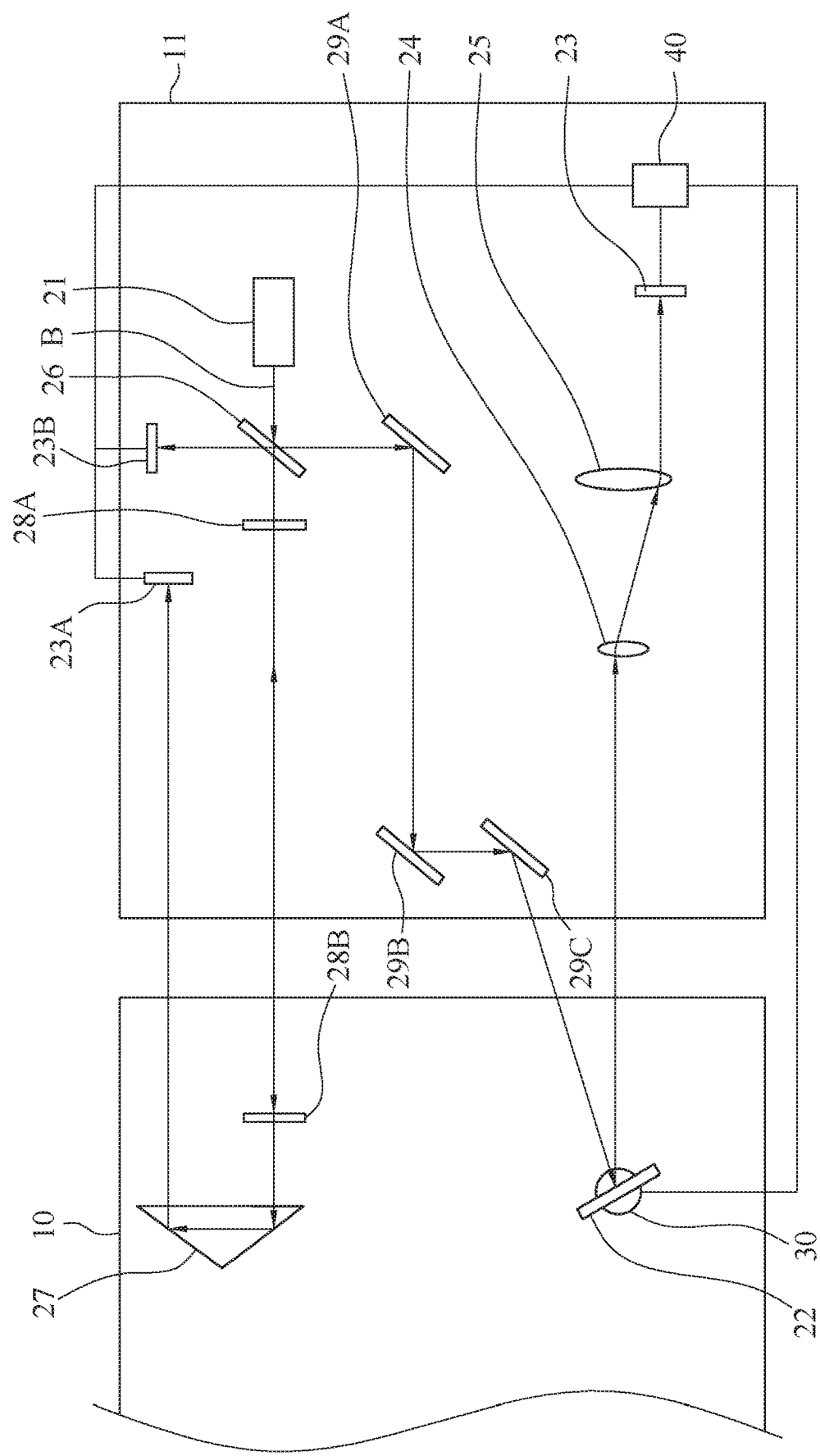
FIG. 13 illustrates a schematic architectural view of an error measurement device according to a sixth embodiment of the instant disclosure.

For example, as shown in FIG. 13, in this embodiment, the optical measurement assembly 20 may comprise a plurality of lens assemblies and a plurality of sensors for measuring errors in multiple degrees of freedom. Specifically, as shown in FIG. 13, as compared with the embodiment shown in FIG. 2, in addition to comprising the optical lens 22 and the photoelectric sensor 23, the optical measurement assembly 20 in this embodiment further comprises a beam splitter 26, a corner prism 27, a quarter-wave plate 28A, a beam splitter 28B, a plurality of reflecting mirrors 29A, 29B, 29C, and a plurality of additional photoelectric sensors 23A, 23B. In this embodiment, the optical lens 22, the corner prism 27, and one of the beam splitters 28B are disposed on the moving stage 10, and rest components of the optical measurement assembly 20 are disposed on the fixed stage 11. After the light source 21 emits the light beam B, the light beam B is divided into two light beams (hereinafter, the first light beam and the second light beam) by the beam splitter 26. The first light beam is reflected by the reflecting mirrors 29A, 29B, 29C and illuminates on the optical lens 22, and then the first light beam is transmitted to the photoelectric sensor 23 through the reflection of the optical lens 22. The second light beam passes through the quarter-wave plate 28A and the beam splitter 28, and the second light beam is further divided into two light beams (hereinafter, the third light beam and the fourth light beam). The third light beam passes through the beam splitter 28B and illuminates on the corner prism 27, and the third light beam is refracted by the corner prism 27 and illuminates on the photoelectric sensor 23A. The fourth light beam is reflected by the beam splitter 28B and is transmitted to the photoelectric sensor 23B through the reflection of the beam splitter 26. The processor 40 may be connected to the photoelectric sensors 23, 23A, 23B. Hence, the processor 40 can calculate, according to the variation of positions of the incident light on the photoelectric sensors 23, 23A, 23B, the movement error in multiple degrees of freedom (for example, the positioning error, the straightness error, the angular error, or the like) when the moving stage 10 is moved.

For example, the processor 40 may find the relationship between the variation of position and the movement error by the ray-tracing method so as to obtain the equations below.

$X_{PSD1} = F_{X1}(\delta x, \delta y, \delta z, \varepsilon x, \varepsilon y, \varepsilon z)$ $Y_{PSD1} = F_{Y1}(\delta x, \delta y, \delta z, \varepsilon x, \varepsilon y, \varepsilon z)$ $X_{PSD2} = F_{X2}(\delta x, \delta y, \delta z, \varepsilon x, \varepsilon y, \varepsilon z)$ $Y_{PSD2} = F_{Y2}(\delta x, \delta y, \delta z, \varepsilon x, \varepsilon y, \varepsilon z)$ $X_{PSD3} = F_{X3}(\delta x, \delta y, \delta z, \varepsilon x, \varepsilon y, \varepsilon z)$ $Y_{PSD3} = F_{Y3}(\delta x, \delta y, \delta z, \varepsilon x, \varepsilon y, \varepsilon z)$ In the equations, $X_{PSD1}$ and $Y_{PSD1}$ are respectively the variation of positions sensed by the photoelectric sensor 23B, $X_{PSD2}$ and $Y_{PSD2}$ are respectively the variation of positions sensed by the photoelectric sensor 23A, $X_{PSD3}$ and $Y_{PSD3}$ are respectively the variation of positions sensed by the photoelectric sensor 23, $\delta x$, $\delta y$, $\delta z$ are respectively the horizontal or vertical movement errors at different axis, and $\varepsilon x$, $\varepsilon y$, $\varepsilon z$ are respectively the angular movement errors at different axis. Then, the foregoing results are then input into the first-order Taylor series expansion to obtain the movement errors in multiple degrees of freedom of the moving stage 10 in the linear movement amount, and the obtained movement errors are presented as follows.

$\delta x = f_x(X_{PSD1}, X_{PSD2}, X_{PSD3}, Y_{PSD1}, Y_{PSD2}, Y_{PSD3})$ $\delta y = f_y(X_{PSD1}, X_{PSD2}, X_{PSD3}, Y_{PSD1}, Y_{PSD2}, Y_{PSD3})$ $\delta z = f_z(X_{PSD1}, X_{PSD2}, X_{PSD3}, Y_{PSD1}, Y_{PSD2}, Y_{PSD3})$ $\varepsilon x = g_x(X_{PSD1}, X_{PSD2}, X_{PSD3}, Y_{PSD1}, Y_{PSD2}, Y_{PSD3})$ $\varepsilon y = g_y(X_{PSD1}, X_{PSD2}, X_{PSD3}, Y_{PSD1}, Y_{PSD2}, Y_{PSD3})$ $\varepsilon z = g_z(X_{PSD1}, X_{PSD2}, X_{PSD3}, Y_{PSD1}, Y_{PSD2}, Y_{PSD3})$ However, the embodiments are provided for illustrative examples, but not limitations of the instant disclosure. In one or some embodiments, the optical measurement assembly 20 may comprise one lens component and one sensor (as shown in FIG. 2, the optical lens 22 and the photoelectric sensor 23) to measure the movement error in a single degree of freedom.

Next, as shown in FIG. 3, after the step S03 (namely, the movement error of the moving stage 10 is calculated), at least one selected from the light source 21, the optical lens 22, and the photoelectric sensor 23 is driven by the actuator 30 to perform a relative motion with respect to the moving stage 10 (step S04). The relative motion allows the light beam B emitted by the light source 21 to correspondingly illuminate on the first light-spot position S1 of the sensing area 231 again.

Please refer to FIG. 5. Specifically, after the moving stage 10 is moved by the linear displacement L, the incident position of the light beam B of the light source 21 on the sensing area 231 is deflected from the first light-spot position S1 (as shown in FIG. 2) to the second light-spot position S2 (as shown in FIG. 5). Hence, in general, if the moving stage 10 is to be controlled to perform a long-traveling measurement, the incident position of the light beam B on the sensing area 231 is deflected continuously and exceed beyond the available sensing range of the sensing area 231. As a result, the measurement cannot be accomplished.

Accordingly, based on one or some embodiments of the instant disclosure, the actuator 30 drives at least one selected from the light source 21, the optical lens 22, and the photoelectric sensor 23. For example, the processor 40 may be further connected to the actuator 30 to send a control signal to the actuator 30 to drive the actuator 30, thereby making the light beam B emitted by the light source 21 illuminate on the first light-spot position S1 of the sensing area 231. Therefore, the moving stage 10 can be moved continuously to perform the error measurement procedure. Therefore, the deflection of the light beam B can be prevented, and the light beam B can be prevented from going beyond the available sensing range of the photoelectric sensor 23. Accordingly, the error measurement for long-traveling motion can be achieved with minimum construction cost (i.e., in some embodiments, merely with the addition of the actuator 30).

Figure 4:
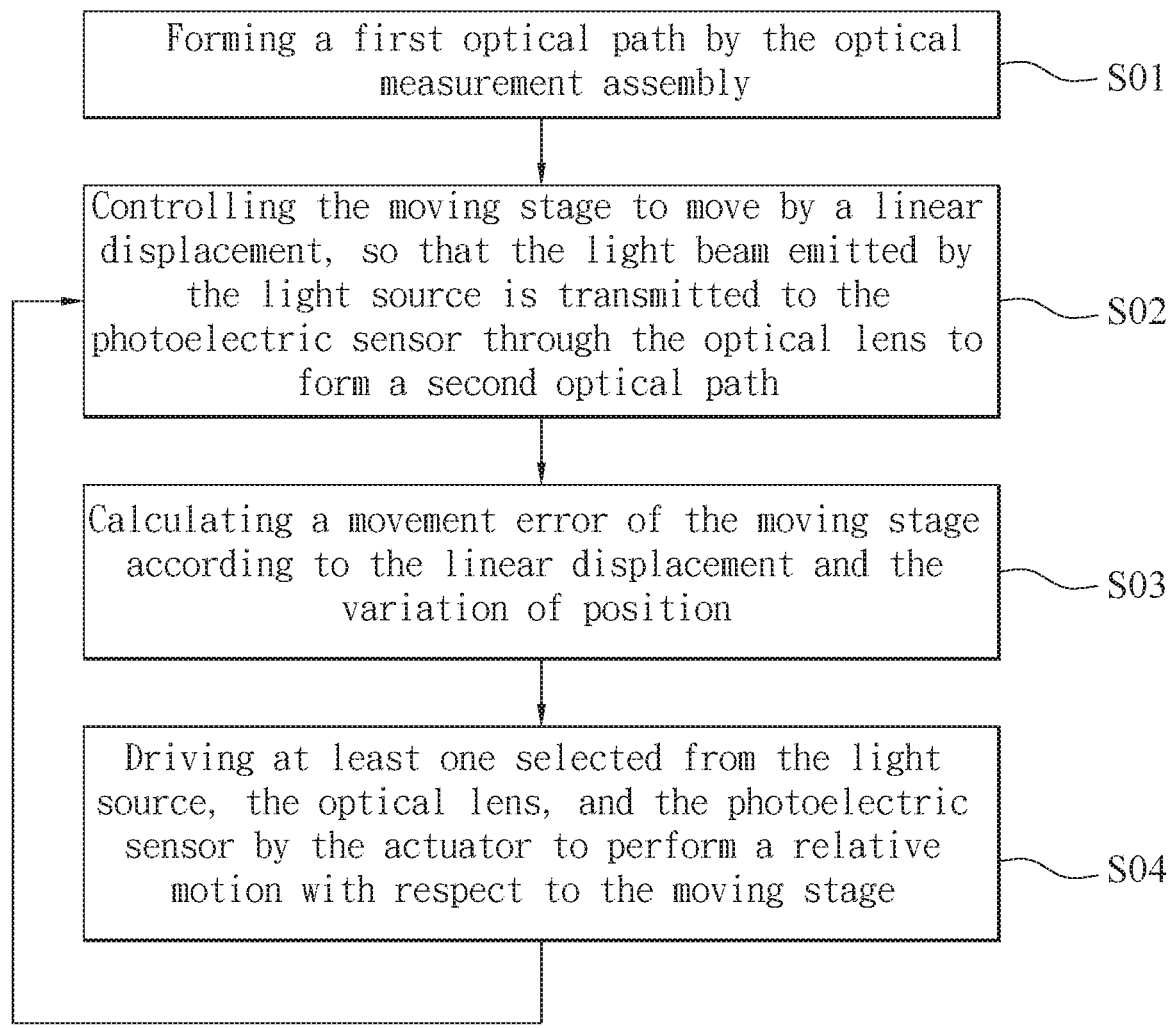
FIG. 4 illustrates a flowchart of an error measurement method according to another exemplary embodiment of the instant disclosure.

For example, as shown in FIG. 4, after the step S04 the steps S02 to S04 may be executed repeatedly to perform the long-traveling error measurement. For example, after the step S04, the processor 40 may continue controlling the moving stage 10 to move by a displacement (the displacement may be the same as or different from the linear displacement L) in the direction away from the fixed stage 11, so that a variation of position is obtained. Next, the processor 40 calculates the movement error according to the variation of position after the moving stage 10 is moved by the displacement. After the variation of position is calculated, the processor 40 controls the actuator 30 to drive at least one selected from the light source 21, the optical lens 22, and the photoelectric sensor 23 to perform a relative motion with respect to the moving stage 10, so that the light beam B emitted by the light source 21 can be correspondingly illuminated on the first light-spot position S1 of the sensing area 231 again, and the error measurement of the moving stage 10 for the next displacement can be executed (e.g., by repeating the steps S02 to S04). Hence, the long displacement error measurement can be achieved.

The step S04 may be achieved by different manners. Descriptions are provided as below.

As shown in FIG. 6, the actuator 30 may be connected to the optical lens 22 to control the optical lens 22 to perform a relative motion (e.g., a rotational motion or a linear motion) with respect to the moving stage 10. Please refer to FIGS. 3, 5, and 6. In this embodiment, the processor 40 is connected to the actuator 30. After the step S03, the processor 40 can control the actuator 30 to drive the optical lens 22 to perform a rotational motion with respect to the moving stage 10 (as indicated by the arrow A2 shown in FIG. 6). Therefore, the incident position of the light beam B of the light source 21 on the optical lens 22 can be changed, and a third optical path P3 (as shown in FIG. 6) different from the second optical path P2 (as shown in FIG. 5) can be formed. The third optical path P3 allows the light beam B of the light source 21 to correspondingly illuminate on the first light-spot position S1 of the sensing area 231 again, so that the moving stage 10 can perform the error measurement procedure for the next displacement.

Alternatively, in another embodiment, as shown in FIG. 7, the actuator 30 may be connected to the light source 21 so as to control the light source 21 to perform a relative motion (e.g., a rotational motion or a linear motion) with respect to the moving stage 10. Please refer to FIGS. 3, 5, and 7. In this embodiment, after the step S03, the processor 40 can control the actuator 30 to drive the light source 21 to perform a rotational motion with respect to the moving stage 10 (as indicated by the arrow A3 shown in FIG. 7). Therefore, the incident position of the light beam B of the light source 21 on the optical lens 22 can be changed, and a third optical path P3 (as shown in FIG. 7) different from the second optical path P2 (as shown in FIG. 5) can be formed. The third optical path P3 allows the light beam B of the light source 21 to correspondingly illuminate on the first light-spot position S1 of the sensing area 231 again, so that the moving stage 10 can perform the error measurement procedure for the next displacement.

In a further option, in yet another embodiment, as shown in FIG. 8, the actuator 30 may be connected to the photoelectric sensor 23 so as to control the photoelectric sensor 23 to perform a relative motion (e.g., a linear motion) with respect to the moving stage 10. Please refer to FIGS. 3, 5, and 8. In this embodiment, after the step S03, the processor 40 can control the actuator 30 to drive the photoelectric sensor 23 to perform a linear motion with respect to the moving stage 10 (as indicated by the arrow A4 shown in FIG. 8). Therefore, the center portion of the sensing area 231 of the photoelectric sensor 23 (that is, the first light-spot position S1) can be moved to correspond to the light beam B of the light source 21. Accordingly, the light beam B of the light source 21 can correspondingly illuminate on the first light-spot position S1 of the sensing area 231 without changing the second optical path P2.

In some embodiments, the actuator 30 may be connected to at least two selected from the light source 21, the optical lens 22, and the photoelectric sensor 23 and drives the selected at least two components to perform a relative motion with respect to the moving stage 10. Hence, the optical path can be changed, so that the light beam B correspondingly illuminates on first light-spot position S1 of the sensing area 231 again. Accordingly, the movement amount of the components (the light source 21, the optical lens 22, and the photoelectric sensor 23) can be reduced greatly, thereby facilitating the long-traveling error measurement of the moving stage 10.

As shown in FIGS. 3 and 5, in the step S04, the processor 40 may calculate a motion parameter (e.g., the rotation angle or the linear movement distance) according to the variation of position between the first light-spot position S1 and the second light-spot position S2, so that the processor 40 can control the actuator 30 to drive, according to the motion parameter, at least one selected from the light source 21, the optical lens 22, and the photoelectric sensor 23 to perform a relative motion. For example, when the variation of position is larger, the motion parameter calculated by the processor 40 allows the actuator 30 to drive the light source 21 or the optical lens 22 with a larger rotation angle (as shown in FIGS. 6 and 7) or allows the actuator 30 to drive the photoelectric sensor 23 with a larger linear movement distance (as shown in FIG. 8).

Moreover, it is understood that the measurement devices according to the embodiments shown in FIGS. 9 to 12 can execute the steps S01 to S04. Specifically, in embodiments shown in FIGS. 9 to 12, since at least one selected from the light source 21, the optical lenses 22, 22', and the photoelectric sensor 23 is disposed on the moving stage 10, the optical path can be changed to generate a variation of position on the sensing area 231 after the moving stage 10 is moved. Hence, the movement error of the moving stage 10 can be calculated according to the variation of position. After the movement error is calculated, the actuator 30 can be controlled to drive at least one selected from the light source 21, the optical lenses 22, 22', and the photoelectric sensor 23 to perform a relative motion with respect to the moving stage 10, so that the light beam B is adjusted to be illuminated on the original position of the sensing area 231 (i.e., the first light-spot position S1). Accordingly, the moving stage 10 can perform the error measurement procedure for next displacement. Details for the descriptions are omitted here.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An error measurement method of linear stage, comprising:
   (a) forming a first optical path by using an optical measurement assembly, wherein the optical measurement assembly comprises a light source, an optical lens, and a photoelectric sensor; the light source, the optical lens, and the photoelectric sensor are disposed on a moving stage of a linear stage, or two of the light source, the optical lens, and the photoelectric sensor are disposed on the moving stage of the linear stage; the first optical path is formed by emitting a light beam with the light source and transmitting the light beam to a sensing area on the photoelectric sensor through the optical lens, and the first optical path correspondingly illuminates on a first light-spot position of the sensing area;
   (b) controlling the moving stage to move by a linear displacement, so that the light beam of the light source is transmitted to the photoelectric sensor through the optical lens to form a second optical path, wherein the second optical path correspondingly illuminates on a second light-spot position of the sensing area, and a variation of position is between the first light-spot position and the second light-spot position;
   (c) calculating a movement error of the moving stage according to the linear displacement and the variation of position; and
   (d) driving at least one selected from the light source, the optical lens, and the photoelectric sensor to perform a relative motion with respect to the moving stage by using an actuator, wherein the relative motion makes the light beam correspondingly illuminate on the first light-spot position of the sensing area again.

2. The error measurement method according to claim 1, wherein the step (d) comprises: calculating a motion parameter according to the variation of position, wherein the actuator drives at least one selected from the light source, the optical lens, and the photoelectric sensor to perform the relative motion according to the motion parameter.

3. The error measurement method according to claim 1, wherein in the step (d), the actuator drives at least two selected from the light source, the optical lens, and the photoelectric sensor to perform the relative motion.

4. The error measurement method according to claim 1, wherein in the step (d), the actuator drives the light source or the optical lens to perform the relative motion with respect to the moving stage to form a third optical path, and the third optical path makes the light beam correspondingly illuminate on the first light-spot position of the sensing area again.

5. The error measurement method according to claim 4, wherein the relative motion is a rotational motion or a linear motion.

6. The error measurement method according to claim 1, wherein in the step (d), the actuator drives the photoelectric sensor to perform the relative motion with respect to the moving stage, so that the second optical path correspondingly illuminates on the first light-spot position of the sensing area.

7. The error measurement method according to claim 1, wherein in the step (b), the second light-spot position is adjacent to a boundary of the sensing area.

8. The error measurement method according to claim 1, wherein in the step (a), the optical lens is a reflecting mirror and is disposed on the moving stage, and the light source and the photoelectric sensor are disposed out of the moving stage.

9. The error measurement method according to claim 1, wherein in the step (a), the light source and the photoelectric sensor are disposed on the moving stage, and the optical lens is a reflecting mirror and is disposed out of the moving stage.

10. An error measurement device of linear stage, comprising:
    an optical measurement assembly, comprising a light source, an optical lens, and a photoelectric sensor, wherein the light source, the optical lens, and the photoelectric sensor are disposed on a moving stage of a linear stage, or two of the light source, the optical lens, and the photoelectric sensor are disposed on the moving stage of the linear stage; wherein the light source emits a light beam, the light beam is transmitted to a sensing area on the photoelectric sensor through the optical lens to form a first optical path, and the first optical path correspondingly illuminates on a first light-spot position of the sensing area;
    wherein the moving stage is moved by a linear displacement, so that the light beam of the light source is transmitted to the photoelectric sensor through the optical lens to form a second optical path; the second optical path correspondingly illuminates on a second light-spot position of the sensing area, and a variation of position is between the first light-spot position and the second light-spot position;
    an actuator connected to at least one selected from the light source, the optical lens, and the photoelectric sensor; and
    a processor connected to the photoelectric sensor, wherein the processor calculates a movement error of the moving stage according to the linear displacement and the variation of position;
    wherein the processor is further connected to the actuator, and the processor controls the actuator to drive at least one selected from the light source, the optical lens, and the photoelectric sensor to perform a relative motion with respect to the moving stage; the relative motion makes the light beam correspondingly illuminate on the first light-spot position of the sensing area again.

11. The error measurement device according to claim 10, wherein the processor calculates a motion parameter according to the variation of position, and the processor controls the actuator to drive at least one selected from the light source, the optical lens, and the photoelectric sensor to perform the relative motion according to the motion parameter.

12. The error measurement device according to claim 10, wherein the processor controls the actuator to drive at least two selected from the light source, the optical lens, and the photoelectric sensor to perform the relative motion.

13. The error measurement device according to claim 10, wherein the processor controls the actuator to drive the light source or the optical lens to perform the relative motion to form a third optical path, and the third optical path makes the light beam correspondingly illuminate on the first light-spot position of the sensing area again.

14. The error measurement device according to claim 13, wherein the relative motion is a rotational motion or a linear motion.

15. The error measurement device according to claim 10, wherein the processor controls the actuator to drive the photoelectric sensor to perform the relative motion, so that the second optical path correspondingly illuminate on the first light-spot position of the sensing area.

16. The error measurement device according to claim 10, wherein the second light-spot position is adjacent to a boundary of the sensing area.

17. The error measurement device according to claim 10, wherein the optical lens is a reflecting mirror and is disposed on the moving stage, and the light source and the photoelectric sensor are disposed out of the moving stage.

18. The error measurement device according to claim 10, wherein the light source and the photoelectric sensor are disposed on the moving stage, and the optical lens is a reflecting mirror and is disposed out of the moving stage.

\* \* \* \* \*